(12) United States Patent
Ho et al.

(10) Patent No.: US 6,304,839 B1
(45) Date of Patent: Oct. 16, 2001

(54) UNIVERSAL POWER SIMULATOR

(75) Inventors: Alpha Ngai Chung Ho; Whyemun Chan, both of Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/172,968

(22) Filed: Oct. 14, 1998

(51) Int. Cl.[7] ............................................. G06F 17/50
(52) U.S. Cl. ............................ 703/18; 703/21; 703/28; 714/39; 714/40
(58) Field of Search ................................. 703/18, 20, 21, 703/28; 714/39, 40, 43, 44

(56) References Cited

U.S. PATENT DOCUMENTS

| | | | |
|---|---|---|---|
| 4,725,968 | * 2/1988 | Baldwin et al. | 364/550 |
| 5,357,519 | * 10/1994 | Martin et al. | 371/15.1 |
| 5,543,727 | * 8/1996 | Bushard et al. | 324/760 |
| 5,878,053 | * 3/1999 | Koh et al. | 371/22.1 |
| 6,067,506 | * 5/2000 | Goldys et al. | 702/117 |

* cited by examiner

Primary Examiner—Kevin J. Teska
Assistant Examiner—Thai Phan

(57) ABSTRACT

A test system for functionally testing disk drives over a wide range of power conditions. The system simulates the power conditions using a computer controlled system architecture featuring several major components. The first of these components is a computer enhanced with features allowing the computer to communicate with disk drives having either IDE or Small Computer System Interface (SCSI) formats. The computer communicates with a second component termed the programmable power supply (PPS) and a third component having simulation circuitry termed universal power simulator, or UPS. The computer uses a combination of hardware and software to create simulated power conditions which are used to test the disk drives for correct operation and to glean out defective drives. The UPS is responsive to control signals from the host computer and the PPS and sends simulated power signals to the disk drives under test. The UPS includes a variety of subunits in the form of switching circuitry which are responsive to specific power testing conditions to evaluate disk drive performance. Examples of such subunits are a relay decoding and controlling subunit, a power switching subunit, an interface switching subunit, a power ramp subunit, and a spike generating subunit. The test system provides an efficient, compact, programmable, and interactive method of testing disk drives for resilience to anomalous power conditions.

3 Claims, 20 Drawing Sheets

| Figure 5A | Figure 5B |

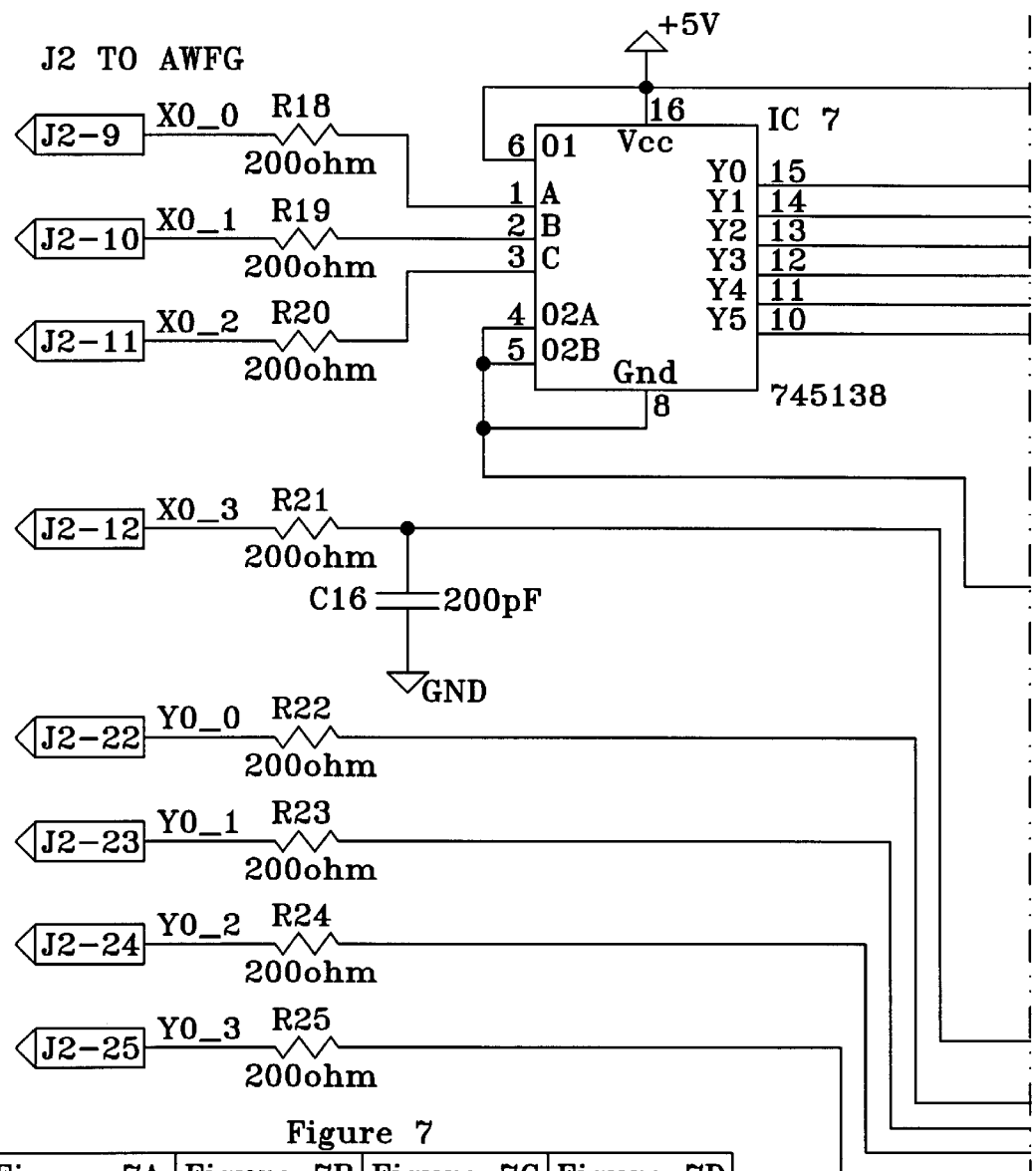
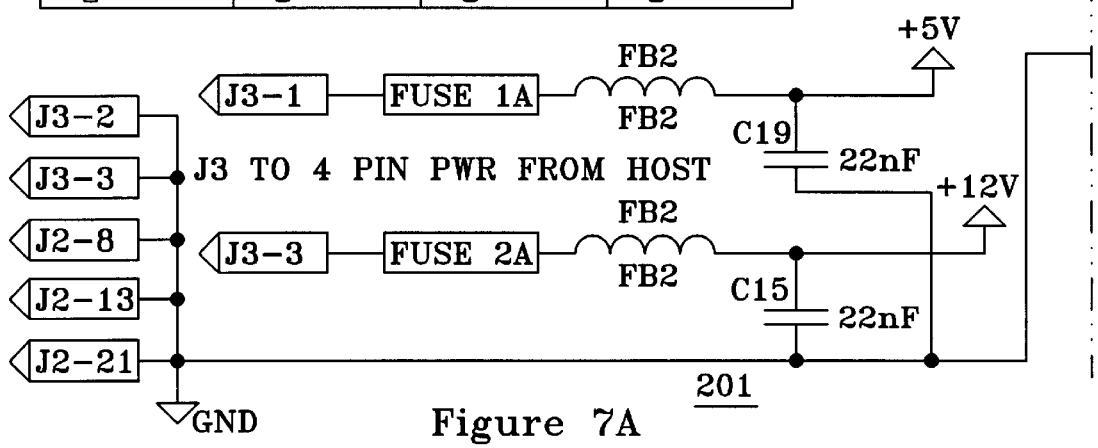
Figure 7
| Figure 7A | Figure 7B | Figure 7C | Figure 7D |
Figure 7A

| Figure 9A | Figure 9B |

UNIVERSAL POWER SIMULATOR

FIELD OF INVENTION

This invention relates to a system and method of testing printed circuit boards used in magnetic disk drives. More particularly, the present invention relates to the testing of disk drives using a system for simulating power conditions related to disk drive failures. Still more particularly, the invention relates to the testing of disk drives for resilience to power spikes, power dips, hot plugging, slow or fast ramp power conditions, power oscillation, switch induced bounce conditions, and power transients.

BACKGROUND OF THE INVENTION

Computer disk drive systems are comprised of two main components, a Head Disk Assembly ("HDA") and the Printed Circuit Board Assembly ("PCBA"). Either or both of these components may fail during use. In order to enhance quality control and prevent disk drive failures in the field, a method of testing disk drives was needed. The present invention is concerned with testing disk drive systems for power related failures. This is accomplished using a power simulator.

In analyzing disk drive failures, it was determined that a sizable fraction of such failures resulted from anomalous power supply conditions. The present art lacks an effective tool for rapidly and effectively analyzing the effects of abnormal or extreme power supply conditions on disk drive systems. The Universal Power Simulator ("UPS") is a testing apparatus for analyzing disk drive performance while the disk drives are subjected to a series of simulated power anomalies. This testing provides the manufacturer with accurate quality control information regarding power related disk drive failures. UPS testing of disk drive systems also insures that defective disk drives are detected and selected out before such drives are marketed. The UPS accomplishes this goal by simulating a wide range of anomalous power conditions (e.g. hot plugging, slow or fast ramp power conditions, ringing, bounce, voltage spikes, voltage dips, power transients, etc.) known to cause disk drive failures. The UPS accomplishes this task in conjunction with a host computer, a programmable power supply, a series of plug-in computer cards, and an application specific computer program.

PURPOSE OF THE INVENTION

The primary object of the present invention is to provide a system for testing disk drive system functionality over a wide range of power conditions. In keeping with this primary object, the present invention integrates a wide range of test mechanisms into an integrated system for conducting a variety of tests.

It is an object of the present invention to test the robustness of HDA's and PCBA's to rapid and excessive rises or drops in input voltage ("voltage spikes" or "voltage dips").

Another object of the present invention to test the robustness of HDA's and PCBA's when they are connected to a "live" power supply line (also known as "hot plugging").

Another object of the present invention to test the robustness of HDA's and PCBA's when subjected to the rapid current switching caused by the bounding action inherent in some types of switches (also called "bounce").

Another object of the present invention to test the robustness of HDA's and PCBA's to unstable or oscillating power supply voltages (also known as "ringing"). Typically, ringing is caused by sudden changes in load or line voltages to which the disk drive's power supply responds poorly.

Another object of the present invention to test the resilience of HDA's and PCBA's to slow or fast ramp power conditions.

Another object of the present invention to test the robustness of HDA's and PCBA's to power transients. For example, those caused by power supply voltage changes due to load or line changes.

SUMMARY OF THE INVENTION

The present invention accomplishes the above-mentioned objects using a computer controlled system architecture featuring several major components.

The first of these components is a Control Host. The Control Host is a computer enhanced with features allowing the computer to communicate with disk drives having either IDE or Small Computer System Interface ("SCSI") formats. The computer is in electrical communication with both a Programmable Power Supply ("PPS") and the UPS. The host computer uses a combination of hardware and software to create simulated power conditions which, in conjunction with the UPS and PPS, are used test disk drives for correct operation, gleaning out defective drives.

The second major component is the PPS. The PPS is connected to, and directed by, the host computer. The function of the PPS is to supply power to the UPS according to instructions provided by the operator. The PPS is connected to both the UPS and the host computer, serving as a power source for the UPS.

The third major component is the UPS. The function of the UPS is to send test power signals to disk drives under test. The UPS receives control signals from the host computer which, in conjunction with the PPS, sends simulated power signals to the disk drives under test. The system subjects disk drives to simulated power conditions and evaluates disk drive performance and suitability for continued use. The UPS features a variety of subunits which are used to evaluate disk drive performance under specific power conditions. Examples of such subunits are a relay decoding and controlling subunit, a power switching subunit, an interface switching subunit, a power ramp subunit, and a spike generating subunit.

This integrated system of host computer, PPS, and UPS provide an efficient, compact, programmable, and interactive method of testing disk drives for resilience to anomalous power conditions.

DETAILED DESCRIPTION OF THE PREFERRED EMBODIMENT

Figure 1:
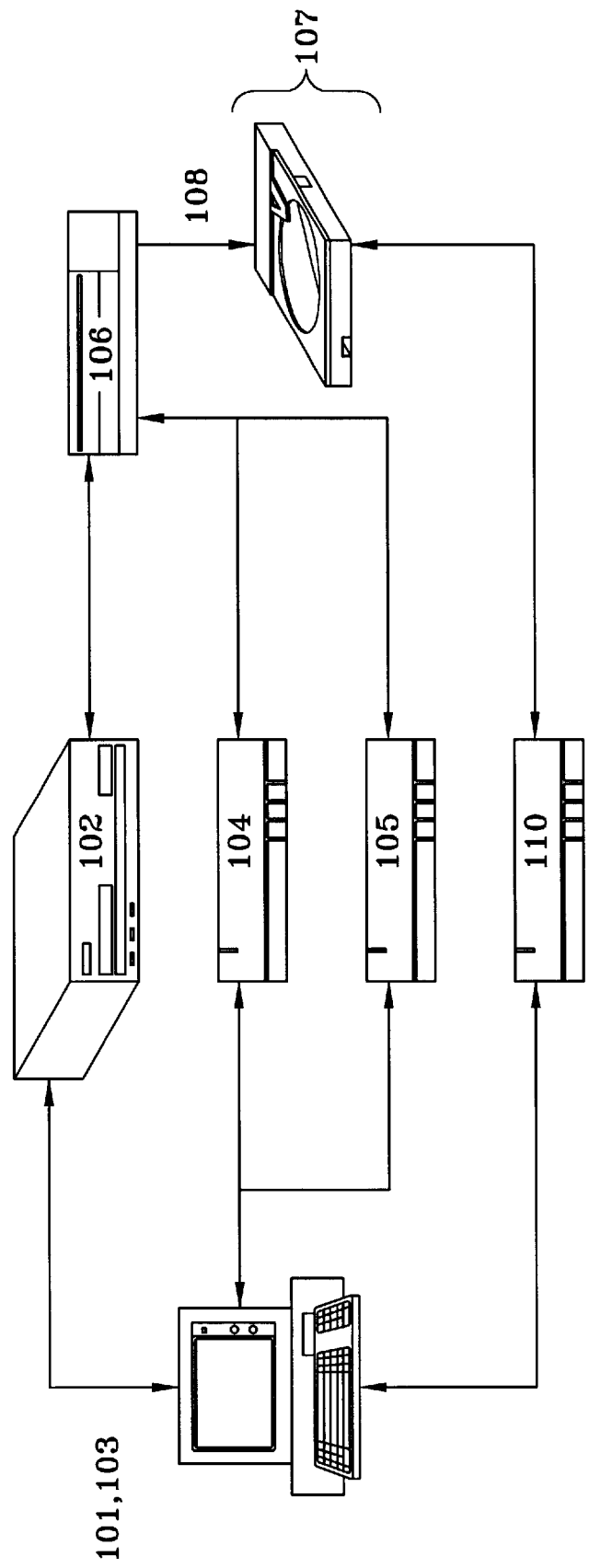
FIG. 1 shows an overall view of the system architecture, in accordance with the present invention.

FIG. 1 illustrates one embodiment of a system for testing disk drives. The entire system is controlled using a host computer (101). By example, the host computer may be a 486DX computer using a DOS 3.1 version (or higher) operating system. The host (101) typically requires a minimum of 4 MB of random access memory and a minimum of one "floppy" disk drive. The host (101) comprises, by example an IBM AT controller, a "floppy" disk controller, a parallel port, and a serial port. The host computer further comprises a series of specialized "plug-in" function cards (104), (105) and (110), depicted in FIG. 1 as being external to host computer (101). The plug-in cards shown in FIG. 1, comprise an internal interface bus card (103), an Arbitrary Waveform Generator, referred to herein as the AWFG card (104), an Analog to Digital Convertor, referred to herein as the ADC card (105) and a system I/O card (110) that is capable of interfacing with IDE or SCSI disk drive systems. Still referring to FIG. 1, interface bus card (103) preferably comprises an IEEE-488 interface card, which among other things, allows host computer (101) to communicate with programmable power supply PPS (102). By way of example, the interface card (103) may be a National Instruments GPIB controller card. As previously stated, although shown external, the AWFG card (104) and a ADC card (105) are preferably "plug-in" cards for host computer (101). By example, AWFG card (104) may comprise a Metrabyte AWFG card and ADC card (105) may comprise a Metrabyte DAS4 analog/digital converter card. The computer mounted AWFG (104) card is connected to the universal power simulator UPS (106). The computer mounted AWFG (104) connects the UPS (106) to the host computer (101). The ADC card (105) also connects the host computer (101) to the UPS (106). The purpose of the AWFG (104) is to generate power profiles of various shapes and ramp times. Once generated, these power profiles are sent to the UPS (106). The UPS (106) sends these signals to the PPS (102) which downloads the information from the AWFG (104) and sends the appropriate signal to the DUT (107). A typical AWFG card (104) has a 32×16 RAM which stores the analog and digital outputs of two identical output channels (ChX and ChY). Memory words are 16 bits in length, with the 12 most significant bits driving the digital-to-analog convertor's and the four least, significant bits providing digital output data. The ADC card (105) is an eight (8) channel, eight (8) bit, successive approximation analog/digital convertor. The full scale input to each channel is −5 volts to +5 volts with a 0.03906 volt resolution. The ADC card samples the voltages at the DUT terminals of the UPS prior to distribution for feedback to the Control Host for purposes of compensating for voltage drop across the UPS.

FIG. 1 also shows the second major component of the disk drive test system, which is the programmable power supply PPS (102). The PPS (102) is, by example, a Philips PM2813 programmable power supply. By example, PPS (102) comprises a three (3) channel programmable isolated power supply, each channel capable of delivering up to 60W of power. Two of the channels deliver power to the disk drive under test DUT (107). Typically, the power delivered to DUT (107) is delivered by one five (5) volt channel and one twelve (12) volt channel. A third channel sends power to the charging capacitors in UPS (106), which are used to simulate power spikes. Communication between the host Computer (101) and PPS (102) is accomplished via IEEE-488 interface card (103).

Figure 2:
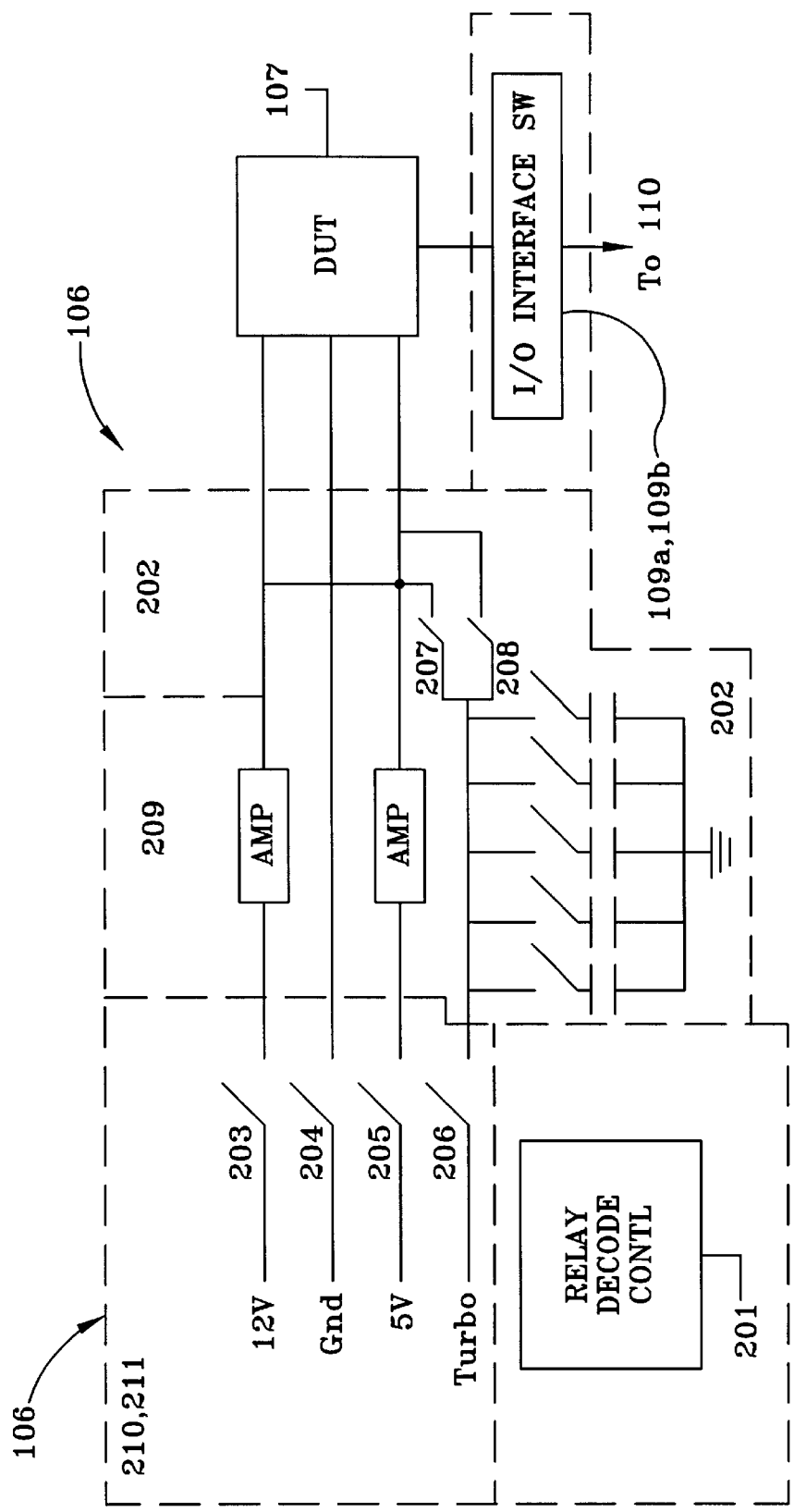
FIG. 2 shows a UPS hardware block diagram in schematic form, in accordance with the present invention.

FIG. 1 also depicts the third major component, namely the universal power simulator, UPS (106). With reference to FIGS. 1 and 2, the UPS (106) is a specially designed piece of hardware with five (5) functional units (201), [(210), (211)], (209), (202) and [(109a), (109b)]. Accordingly, UPS (106) comprises a relay decoding and controlling unit (201), a power switching unit [(210), (211)] comprising a hot plugging unit (210) and a high capacitance unit (211), a power ramp unit 209, a spike generating unit (202) and the IDE/SCSI I/O interface switching units [(109a), (109b)]. UPS (106) is powered by PPS (102) and interconnected to the host computer through the AWFG card (104), ADC card (105) and via the IDE/SCSI I/O interface switching [(109a), (109b)]. The computer controlled UPS (106) is connected to the DUT (107). UPS (106) sends a variety of computer generated power signals to the DUT (107) by connections (108) in order to test the operating characteristics of the DUT (107). The DUT (107) is also connected to host computer (101) by I/O interface switching unit [(109a), (109b)], comprising relay circuitry for an IDE interface, or SCSI port, (which one is used depends on the type of disk drive being tested). During operation, host computer (101) is provided with a number of pre-programmed test sequences which are accessed and selected by the user. Each test subjects DUT (107) to a set of pre-programmed power conditions. The operating behavior of DUT (107) is examined during and after being subjected to the pre-programmed power conditions. The DUT is expected to perform within a given set of operating parameters, both, during and after testing. Should the DUT fail any of the tests it is considered defective and is rejected.

Figure 4A:
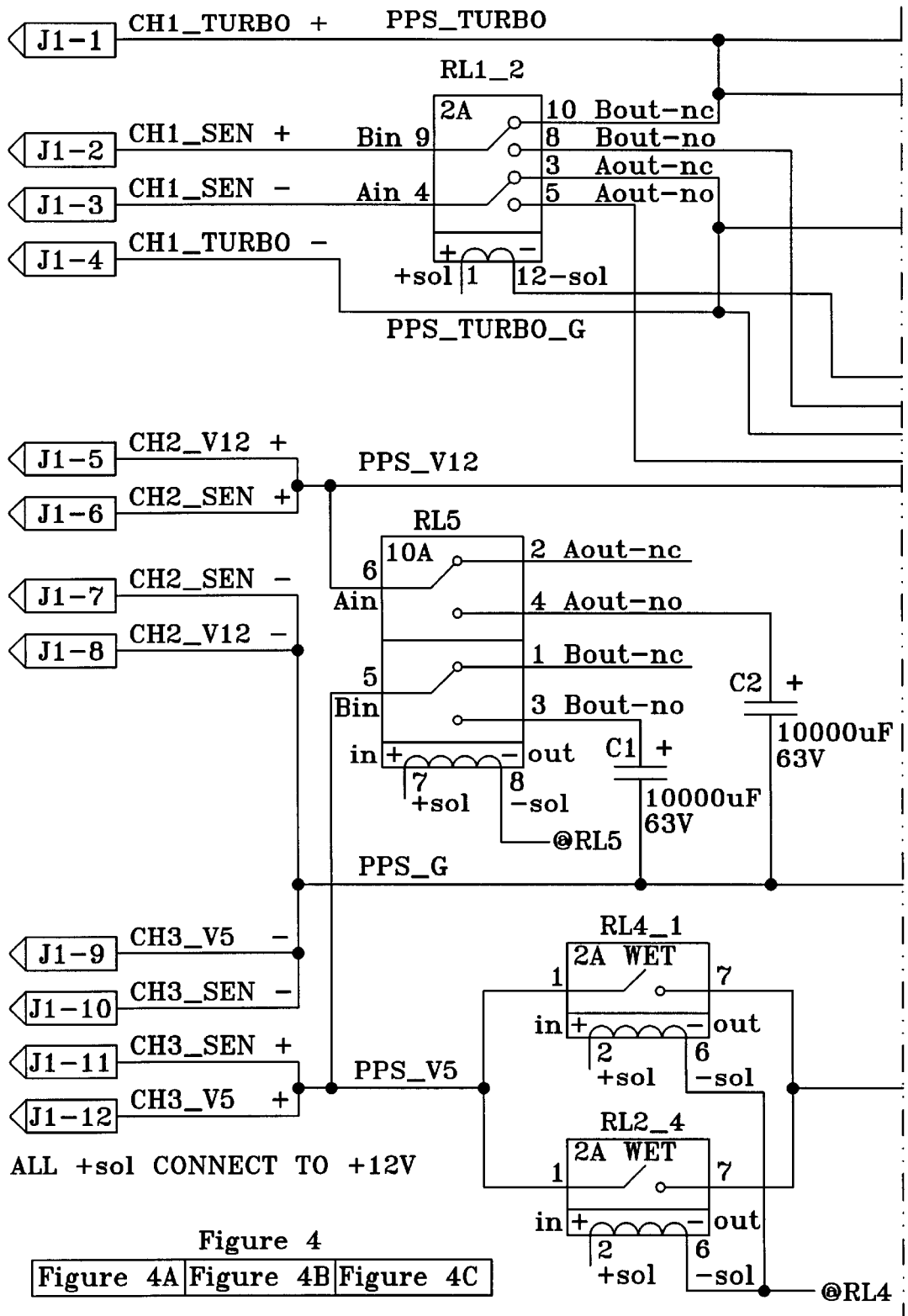
FIG. 4 shows a detailed electrical schematic of a power switching subunit of the UPS, referred to herein as the hotplug and hi cap module, in accordance with the present invention.
Figure 4B:
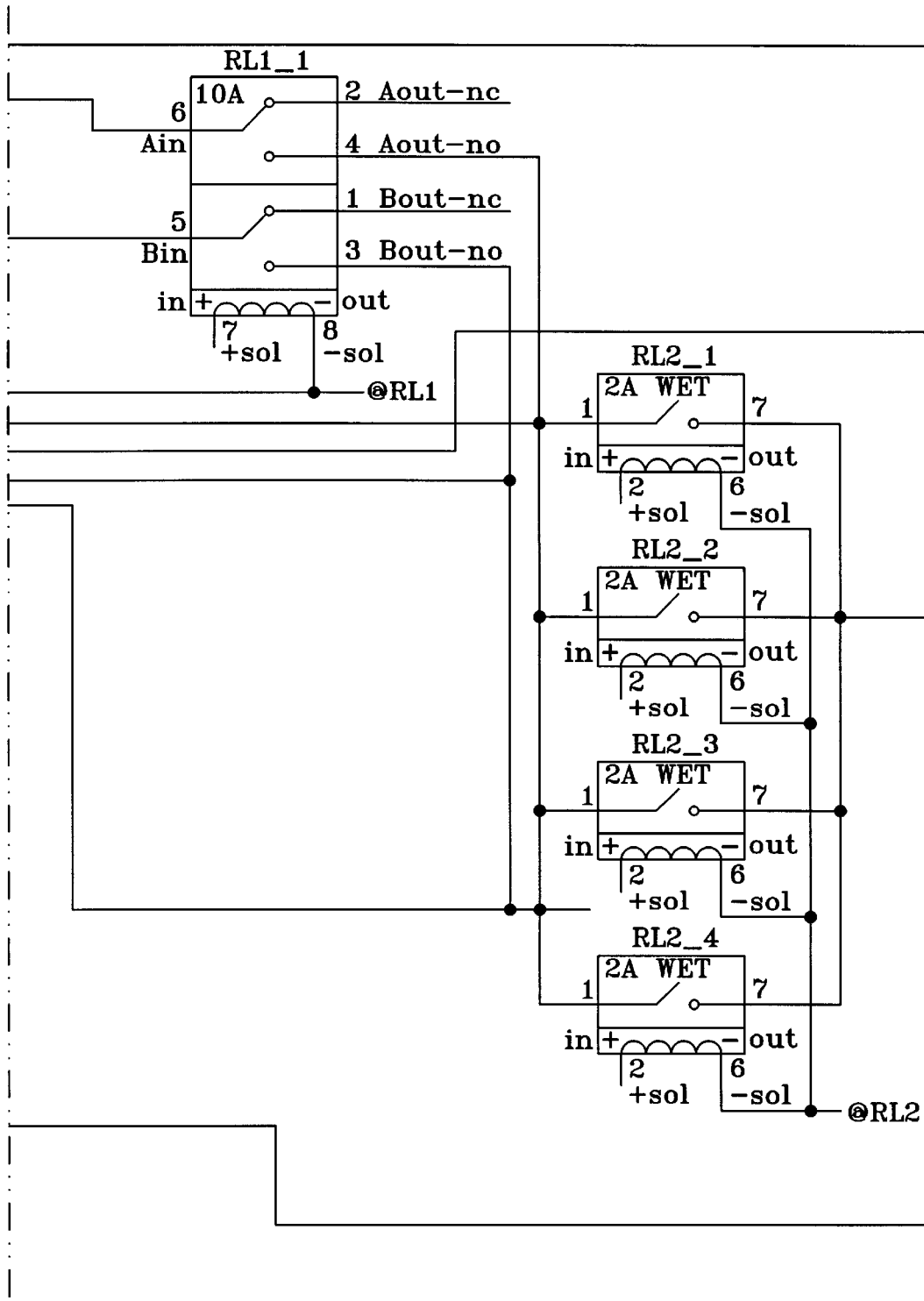
Figure 4C:
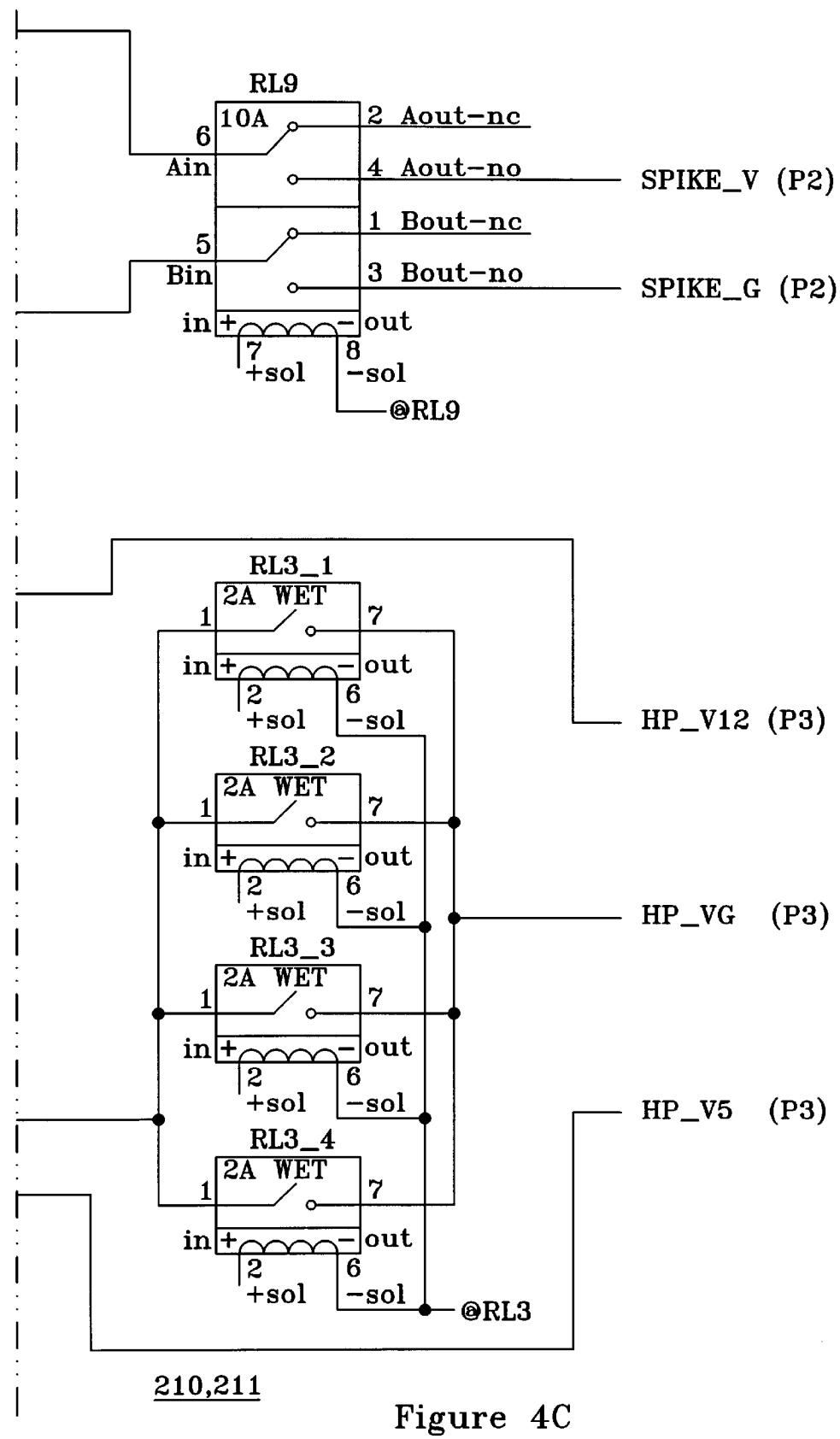
Figures 5, 5A:
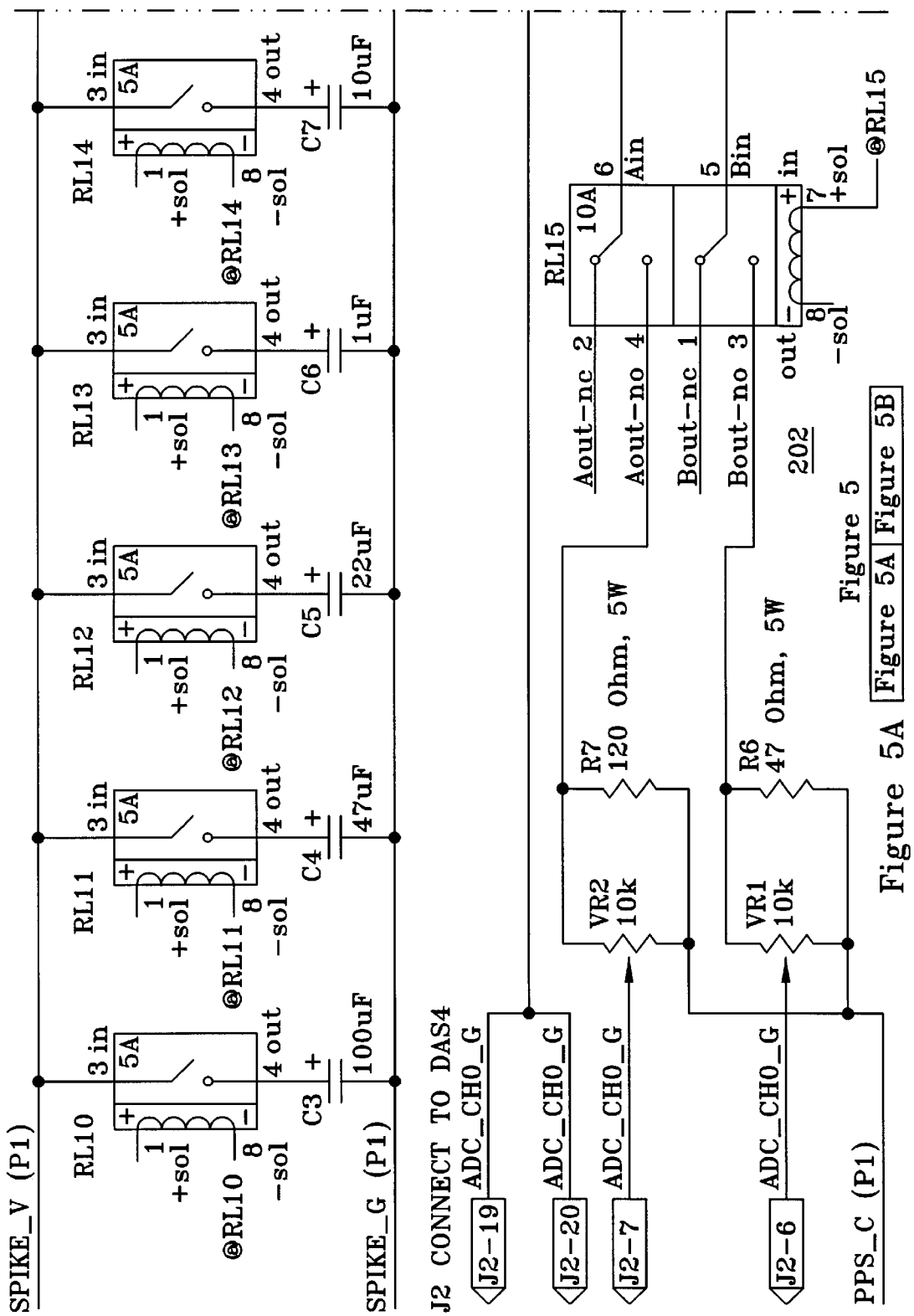
FIG. 5 shows a detailed electrical schematic of a spike generator and ADC module subunit of the UPS, in accordance with the present invention.
Figure 5B:
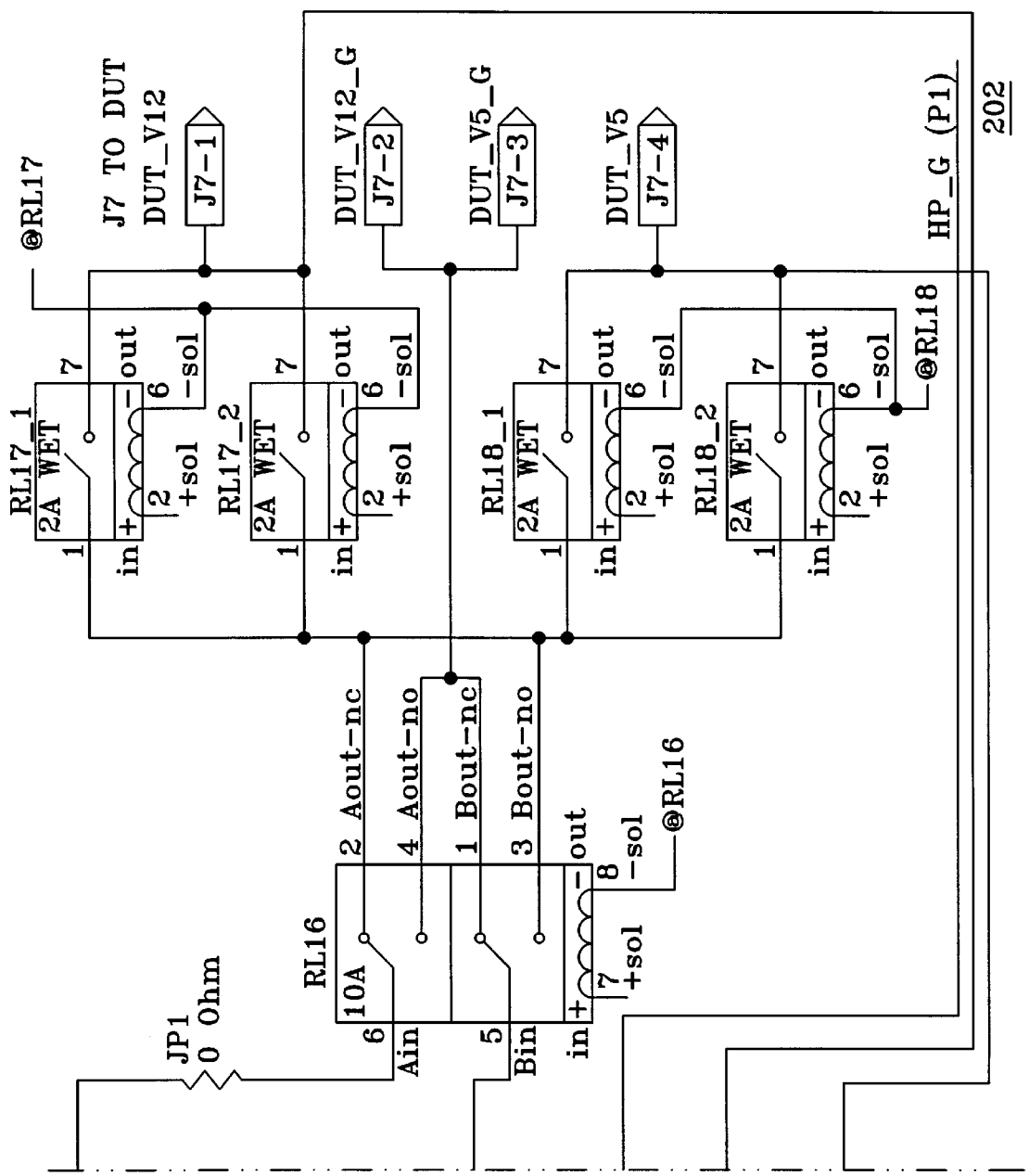
Figure 6A:
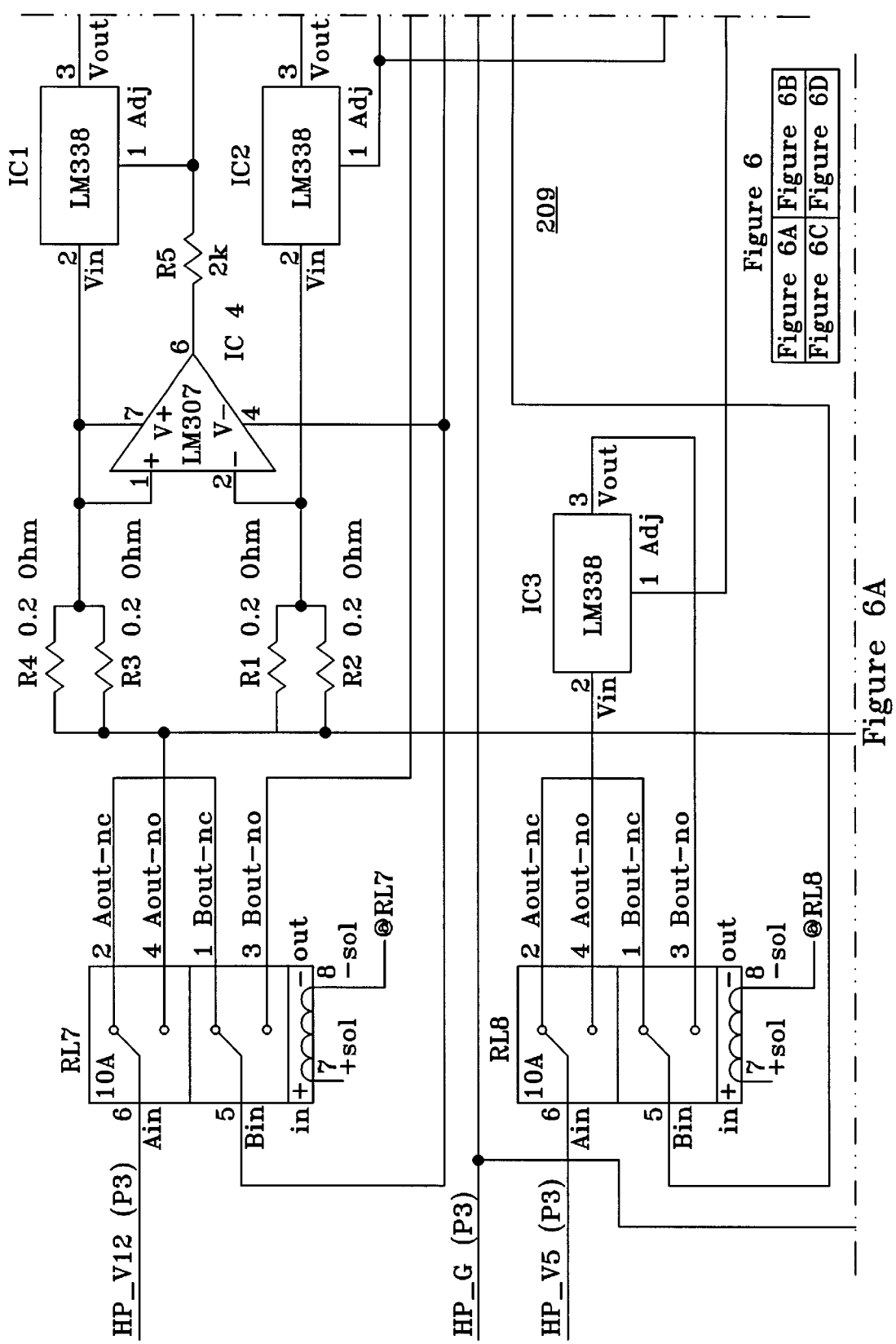
FIG. 6 shows a detailed electrical schematic of a ramp module subunit of the UPS, in accordance with the present invention.
Figure 6B:
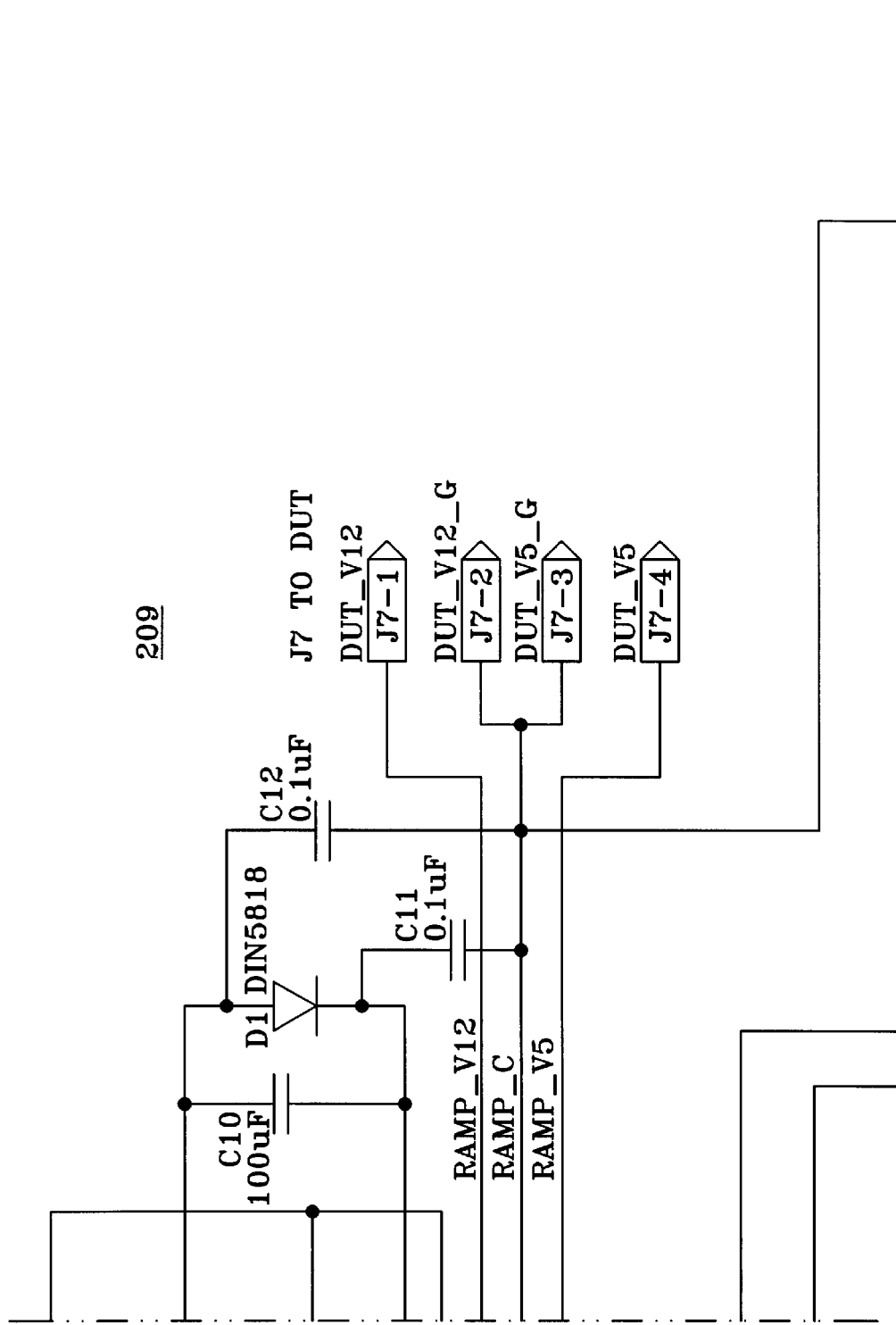
Figure 6C:
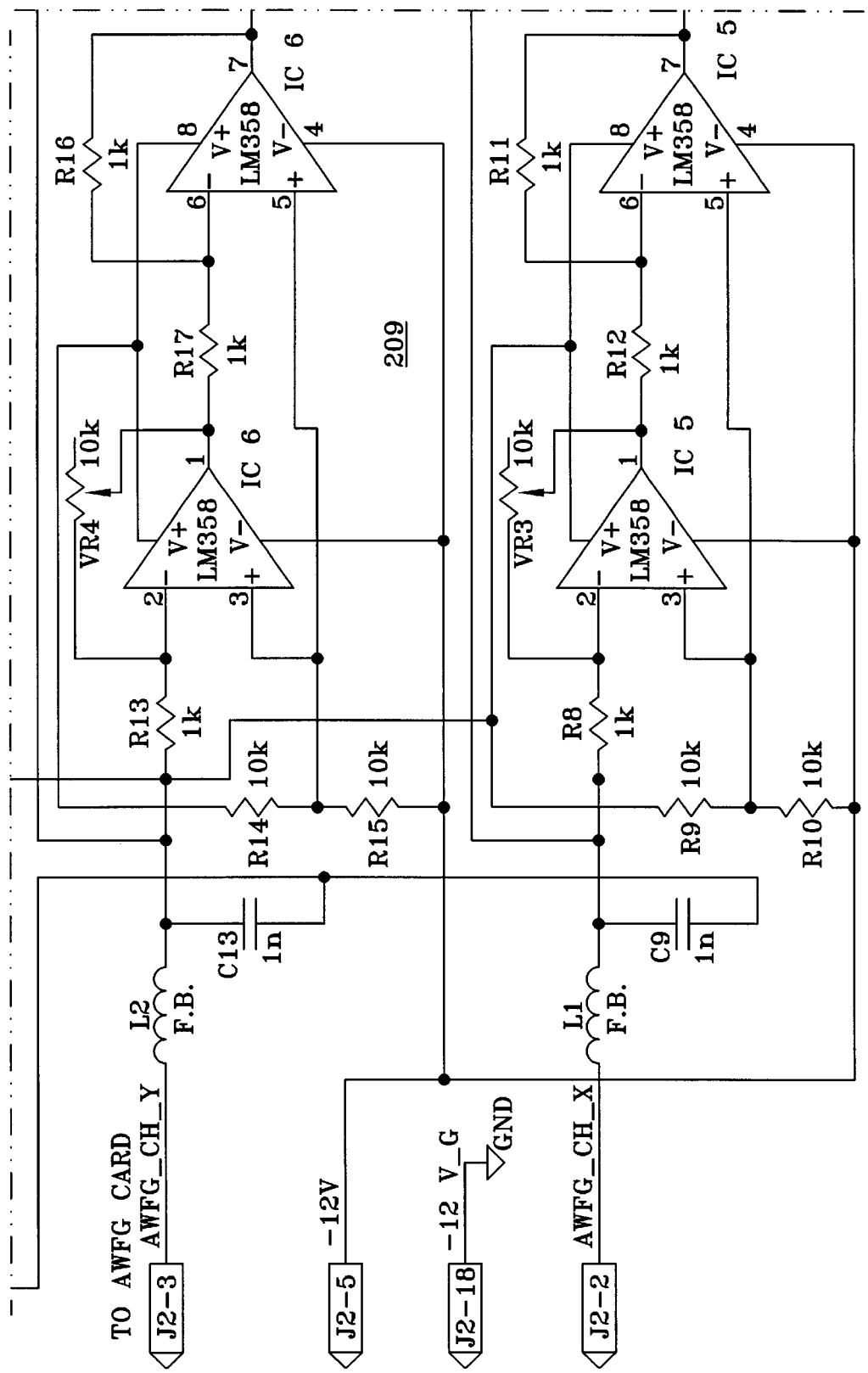
Figure 6D:
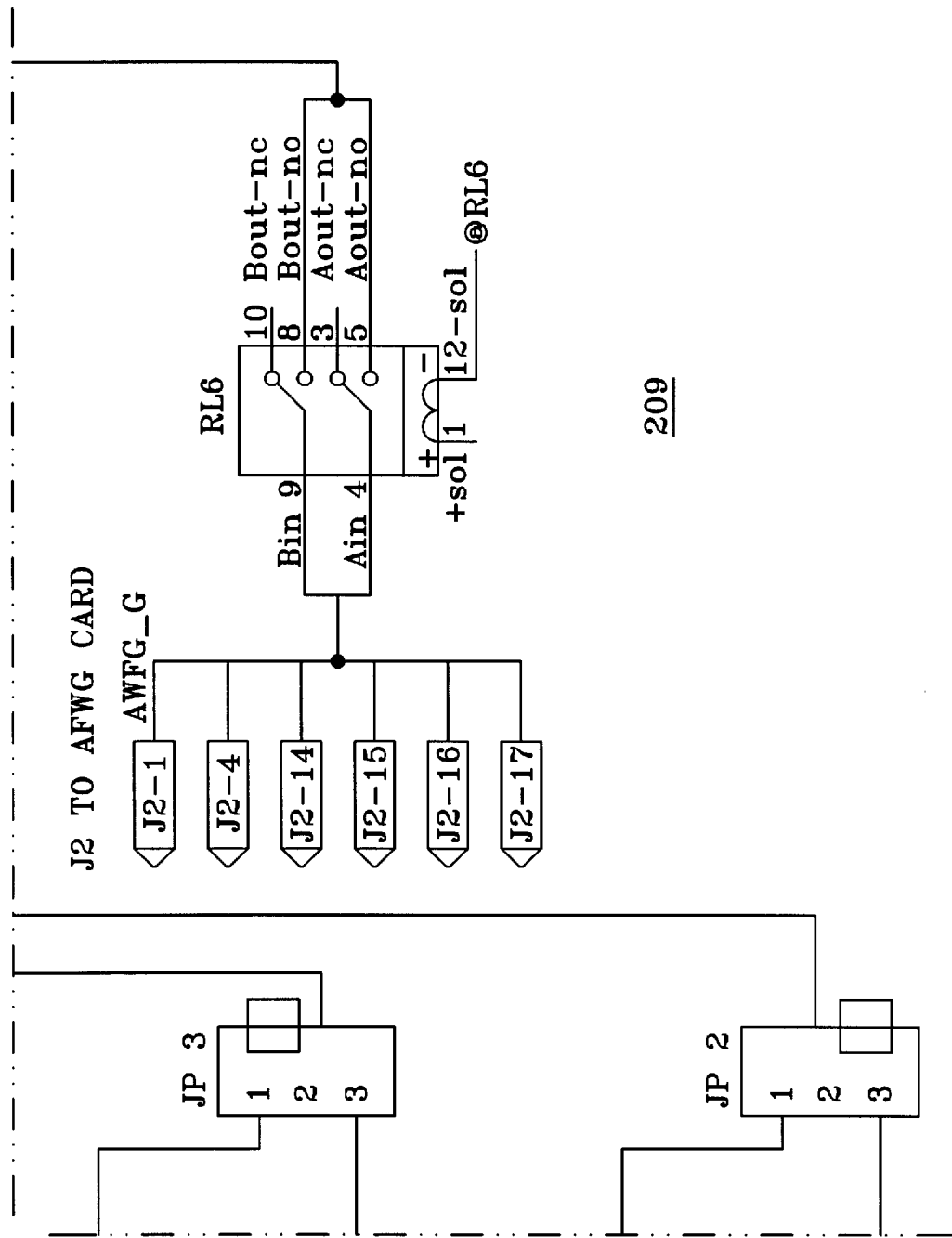
Figure 7B:
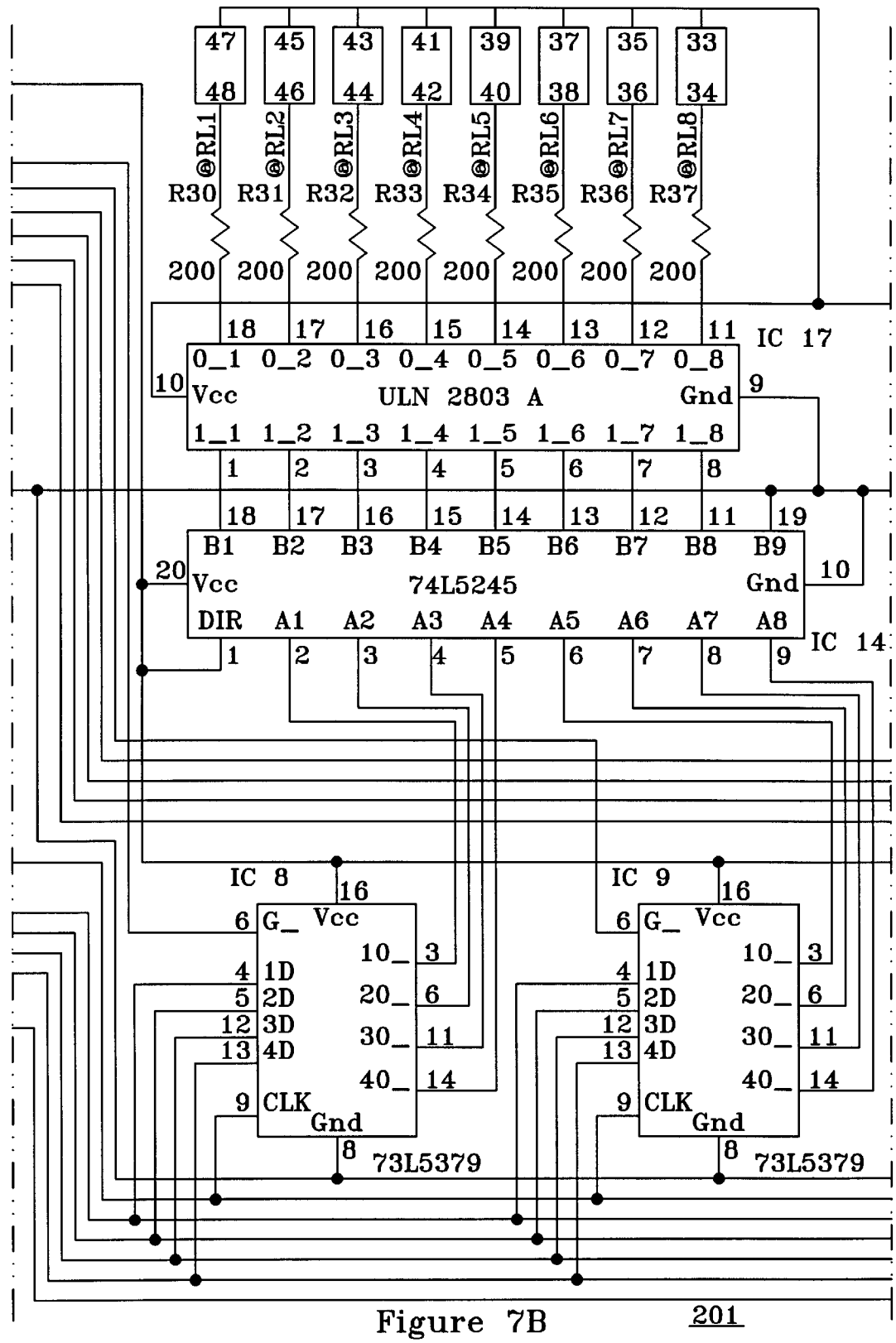
FIG. 7 shows a detailed electrical schematic of a relay control module subunit of the UPS, in accordance with the present invention.
Figure 7C:
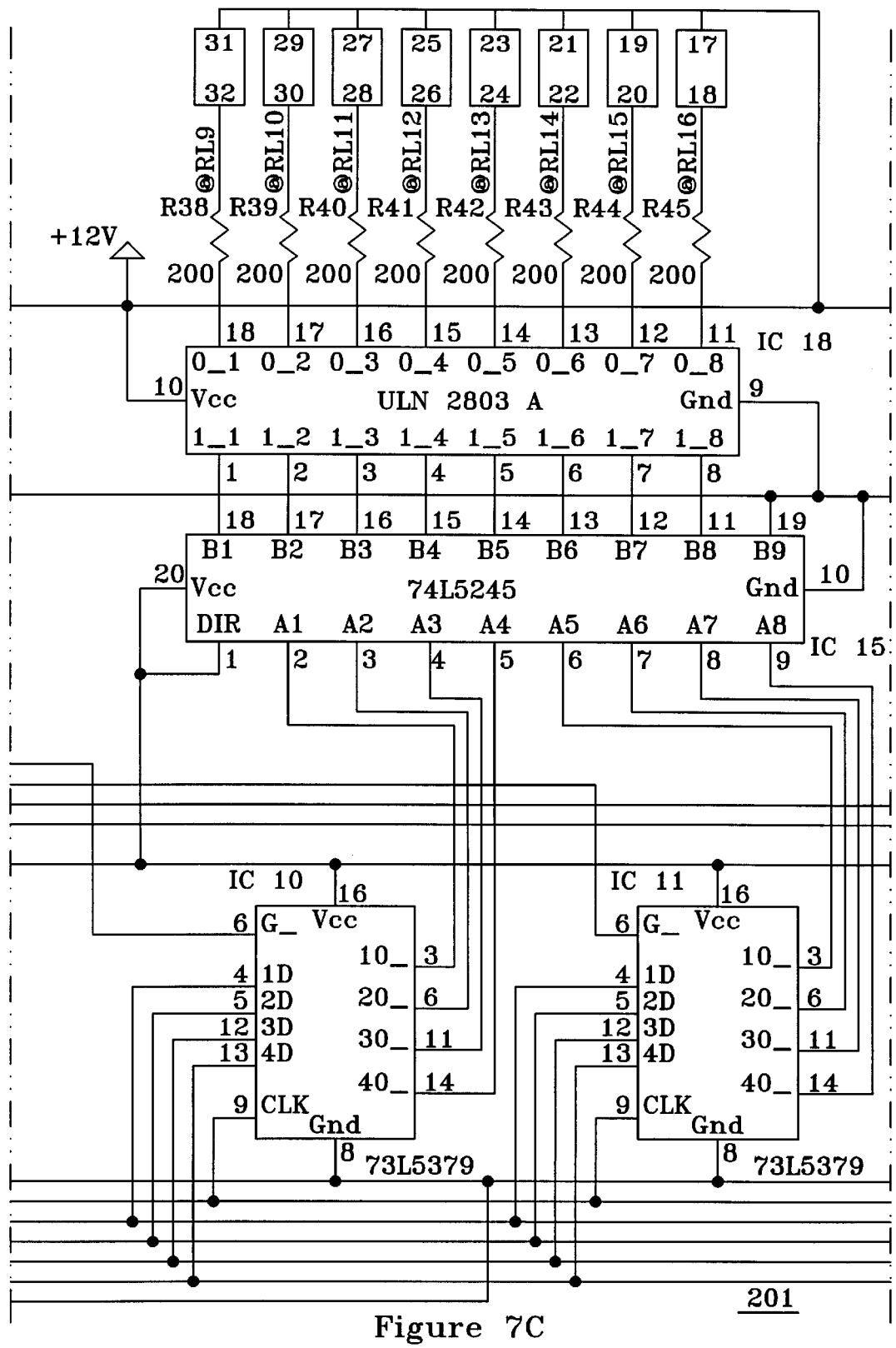
Figure 7D:
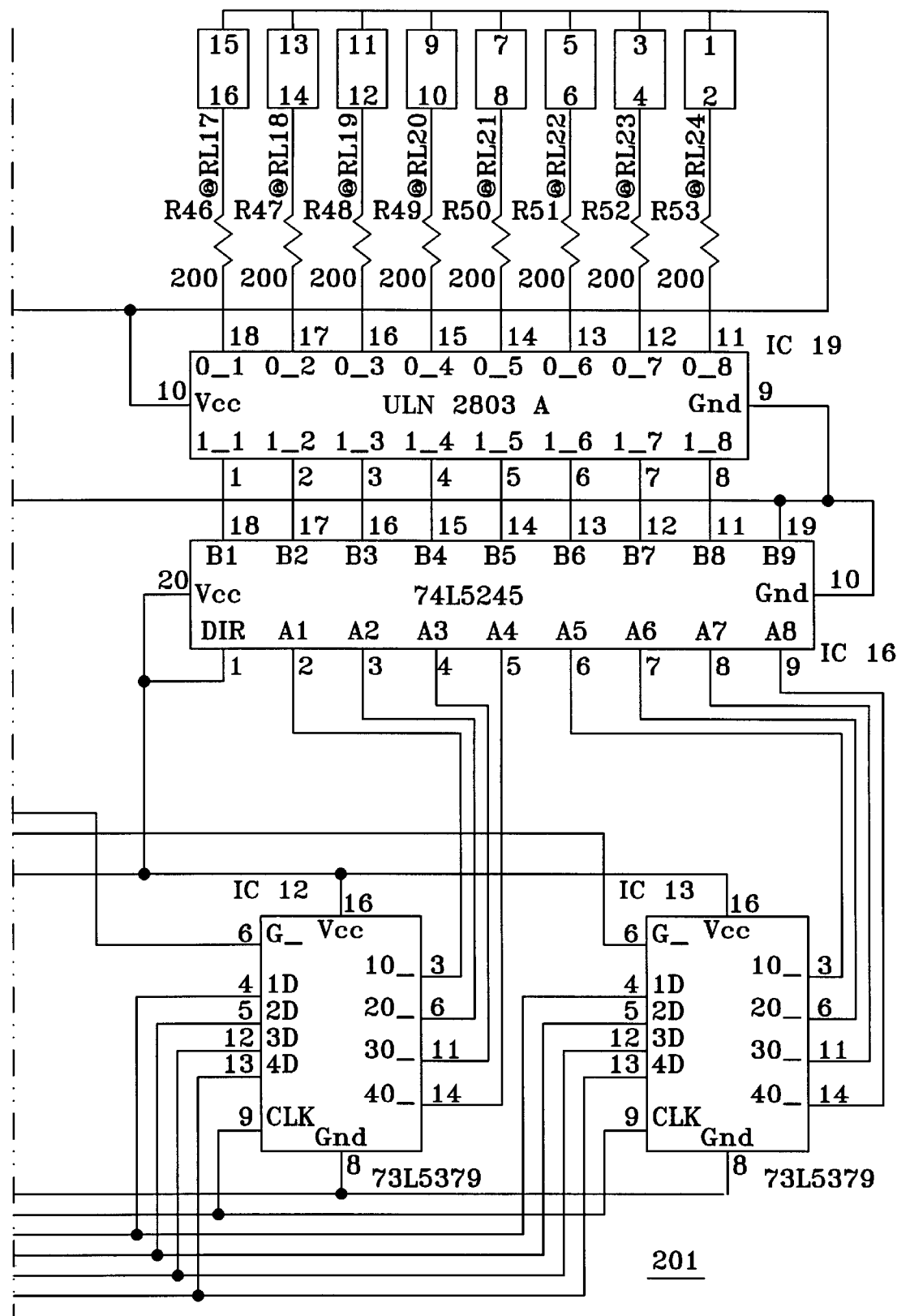

FIG. 2 shows a generalized block diagram schematic of UPS (106). As depicted, UPS (106) comprises relay decoding/controlling unit (201), which controls the internal UPS circuit configuration and controls operation of the UPS power switching relays (203, 204, 205, and 206) of power switching unit comprising circuitry (210), (211), power ramping amps 209, and spike generating subunits (202). FIG. 2 also shows the power line connections via relays 207, 208 from UPS (106) to DUT (107). The drive's response is interfaced back to host computer's system I/O card (110) via I/O interface switching relay circuitry enumerated as (109a), (109b). A detailed electrical schematic of relay decoding/ controlling unit (201) is shown in FIG. 7. Similarly a more detailed electrical schematic of power switching unit (210), (211) is shown in FIG. 4. Likewise, a more detailed electrical schematic of power ramping amps 209 is shown in FIG. 6, and a more detailed electrical schematic of spike generating subunits (202) is shown in FIG. 5. The IDE/SCSI I/O interface switching function [(109a), (109b)] is detailed in electrical schematics FIGS. 8 and 9.

Figure 3:
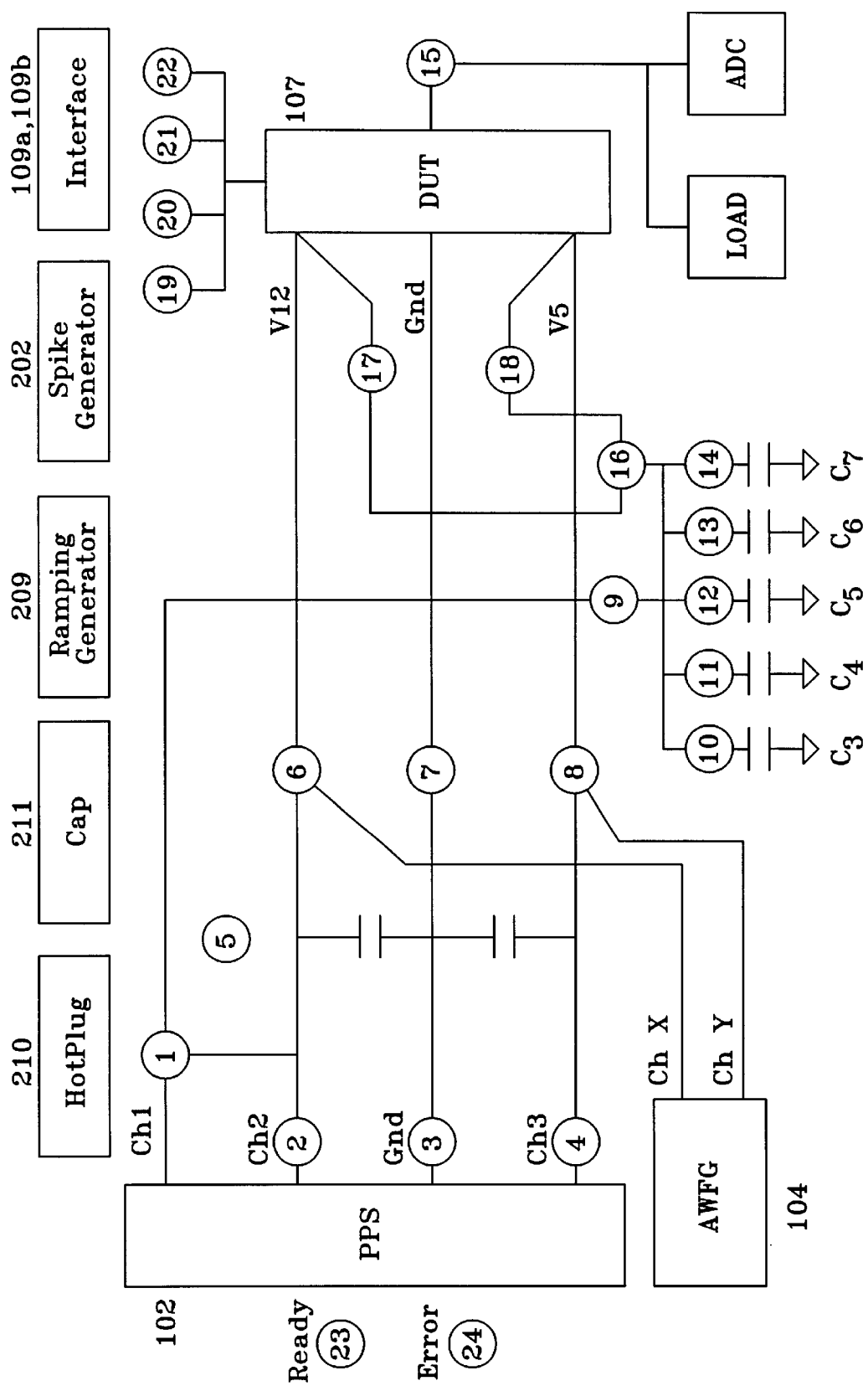
FIG. 3 shows a block diagram of the relay structure of the UPS, in accordance with the present invention.

FIG. 3 shows a generalized electrical diagram of the relays comprising the UPS which control all UPS functions. The relay system comprises a group of 24 relays, divided into six (6) groups of four (4) relays. The relay selection is controlled by the user, or the host computer as directed by the user. Table 1.0 should be used for a complete understanding of the electrical diagram shown in FIG. 3, which describes the functions of each of the 24 relays (depicted in an encircled numeral), as well as the detailed electrical schematics shown in FIGS. 4–9.

TABLE 1.0

Relay types used in UPS and their functions:

| # | Type and Number of Relays | Function |
|---|---|---|
| 1 | Mechanical X 1 | Connect Ch1 and Ch2 of the PPS in parallel |
| 2 | Mercury X 4 | Connect PPS V12 to DUT/Ramping Generator |
| 3 | Mercury X 4 | Connect PPS Ground to DUT/Ramping Generator |
| 4 | Mercury X 2 | Connect PPS V5 to DUT/Ramping Generator |
| 5 | Mechanical X 1 | Connect 10 mF capacitor to both V12 and V5 |
| 6 | Mechanical X 1 | Switch DUT's V12 between PPS/Ramping Generator |
| 7 | Mechanical X 1 | Switch DUT's G between PPS/Ramping Generator |
| 8 | Mechanical 1 | Switch DUT's V5 between PPS/Ramping Generator |
| 9 | Mechanical X 1 | Connect PPS Ch1 for charging spike capacitors |
| 10 | Mechanical X 1 | Select spike capacitor #1: 10 nF |
| 11 | Mechanical X 1 | Select spike capacitor #2: 1 $\mu$F |
| 12 | Mechanical X 1 | Select spike capacitor #3: 22 $\mu$F |
| 13 | Mechanical X 1 | Select spike capacitor #4: 47 $\mu$F |
| 14 | Mechanical X 1 | Select spike capacitor #5: 100 $\mu$F |
| 15 | Mechanical X 1 | Connect loading resistor and ADC to DUT |
| 16 | Mechanical X 1 | Select the spike capacitor decharging polarity |
| 17 | Mercury X 2 | Discharge spike capacitor(s) to DUT's V12 |
| 18 | Mercury X 2 | Discharge spike capacitor(s) to DUT's V12 |
| 19 | Mechanical X 6 | Connect interface cable pin 1 to 12 |
| 20 | Mechanical X 6 | Connect interface cable pin 12 to 24 |
| 21 | Mechanical X 6 | Connect interface cable pin 24 to 36 |
| 22 | Mechanical X 6 | Connect interface cable pin 36 to 48 |
| 23 | Mechanical X 1 | Control the indication LED "Ready" |
| 24 | Mechanical X 1 | Control the indication LED "Error" |

Note: Some relay controls are connected in parallel e.g. Relay #2 "Mercury X 4" means the relay group consists of 4 wet mercury relays, all of which are connected in parallel.
Abbreviations:
PPS: Programmable Power Supply
DUT: Device Under Test
AWFG: Arbitrary Waveform Generator Card
V12: The 12 V power line
ADC: Analog to Digital Convertor Card
V5: The 5 V supply line By example, to understand the interaction between the PPS, the AWFG, the UPS and the DUT, reference to FIG. 3, Table 1, and the electrical schematic shown in FIG. 6 is required. Generally AWFG card (104) connects the PPS to the DUT utilizing the UPS (106) and the relays numbered (6), (7) & (8).

For a test involving a ramp voltage condition, the ramping generator (209) downloads the signal profile from the AWFG (104) (through ChX &/or ChY) and delivers the signal to the DUT through switches (6), (7), & (8). Switches (6), (7), & (8) control whether DUT power is supplied directly by the PPS or passes through the Ramping Amplifier, 209, first. The AWFG card can deliver a signal between +10V/−10V which is enough to drive the 5V line of a DUT. However, power supplied to the 12V line during testing can exceed 15V. This requires two-stage amplification of the signal by the UPS. Typically, this is accomplished using a preamplifier or a first stage amplifier inside the UPS, see generally the amplifier circuitry shown in FIG. 6. The first stage provides voltage amplification from the AWFG, then feeds the amplified signal to a second stage amplifier. The second stage again amplifies the signal to provide sufficient power for driving the DUT.

For a test involving the generation of voltage spikes, Spike Generator (202), comprising a group of relays and capacitors is utilized, see FIG. 5. The preferred embodiment uses nine (9) relays (9–14 & 16–18) to control the charging/discharging of five (5) capacitors ($C_3$–$C_7$). The capacitors typically vary between 10 nF and 100 $\mu$F. The relays are controlled by the host computer (101) which discharges the capacitors as part of a pre-programmed voltage spike subroutine integrated into the software of the host computer. The capacitors of the Spike Generator are charged, then combinations of the capacitors are discharged into either of two power rails with two polarities (via relay 207 & 208 shown in FIG. 2). The discharge of charged capacitors generates a single voltage spike whose amplitude and width is determined by the voltage stored in the capacitors, capacitance, and the impedance of the DUT. Each DUT is subjected to a series of varied voltage spikes through each disk power line (5V or 12V). For example, power spikes sent through the 5V line will start at 7V becoming progressively greater in amplitude until 14V is reached. In this way, each DUT is tested for resilience to voltage surges applied through the 5V line. Similarly, voltage spikes are sent through the 12V power line, starting, for example at 15V increasing to 30V. This tests each DUT for resilience to voltage surges applied through the 12V line. After each spike, the disk drive is tested for proper function. Disk drives which function improperly fail the test and are discarded.

Figure 8A:
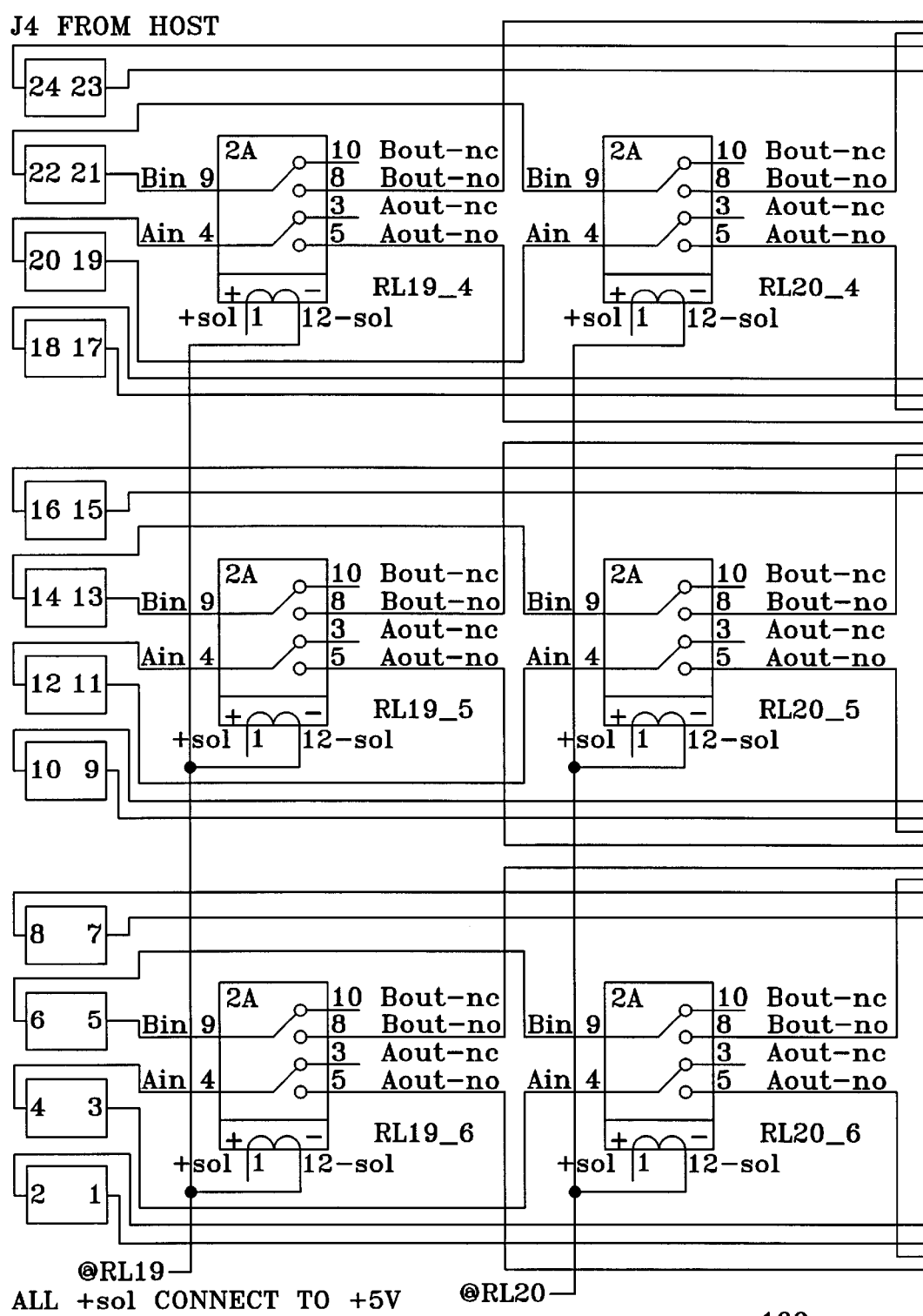
FIG. 8 shows a detailed electrical schematic of a first interface switching and LED module subunit of the UPS, in accordance with the present invention.
Figure 8B:
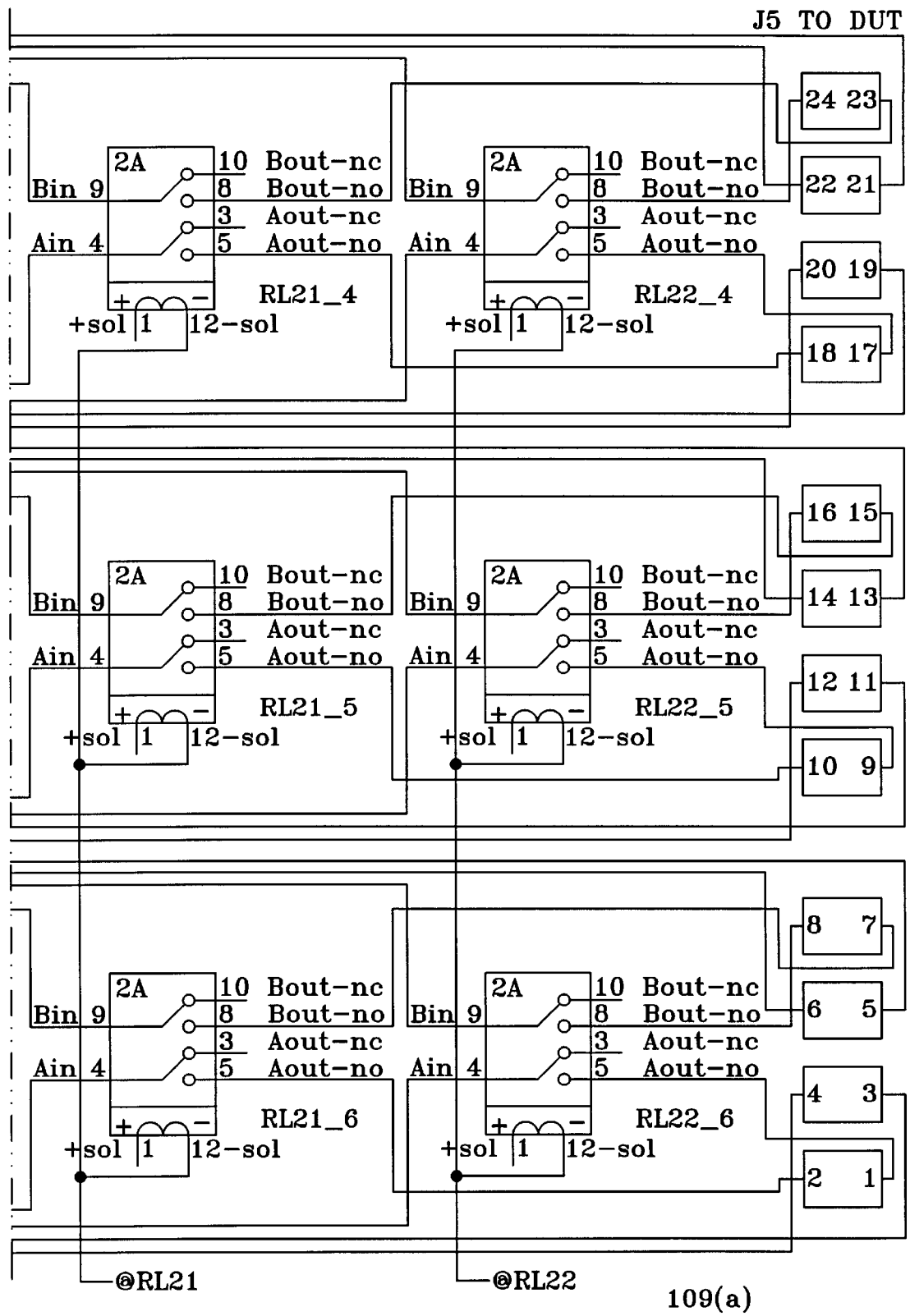
Figures 9, 9A:
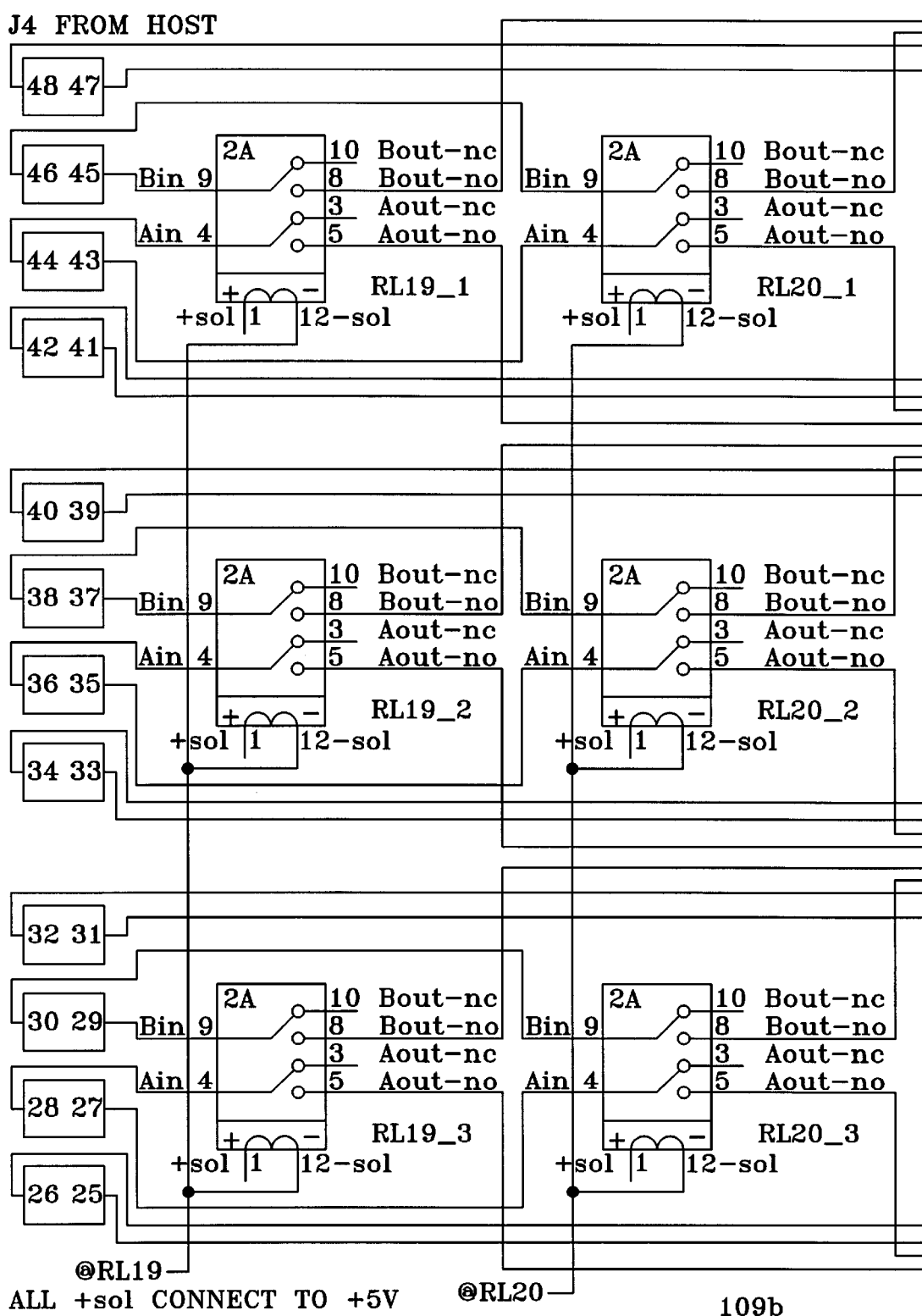
FIG. 9 shows a detailed electrical schematic of a second interface switching and LED module subunit of the UPS, in accordance with the present invention.
Figure 9B:
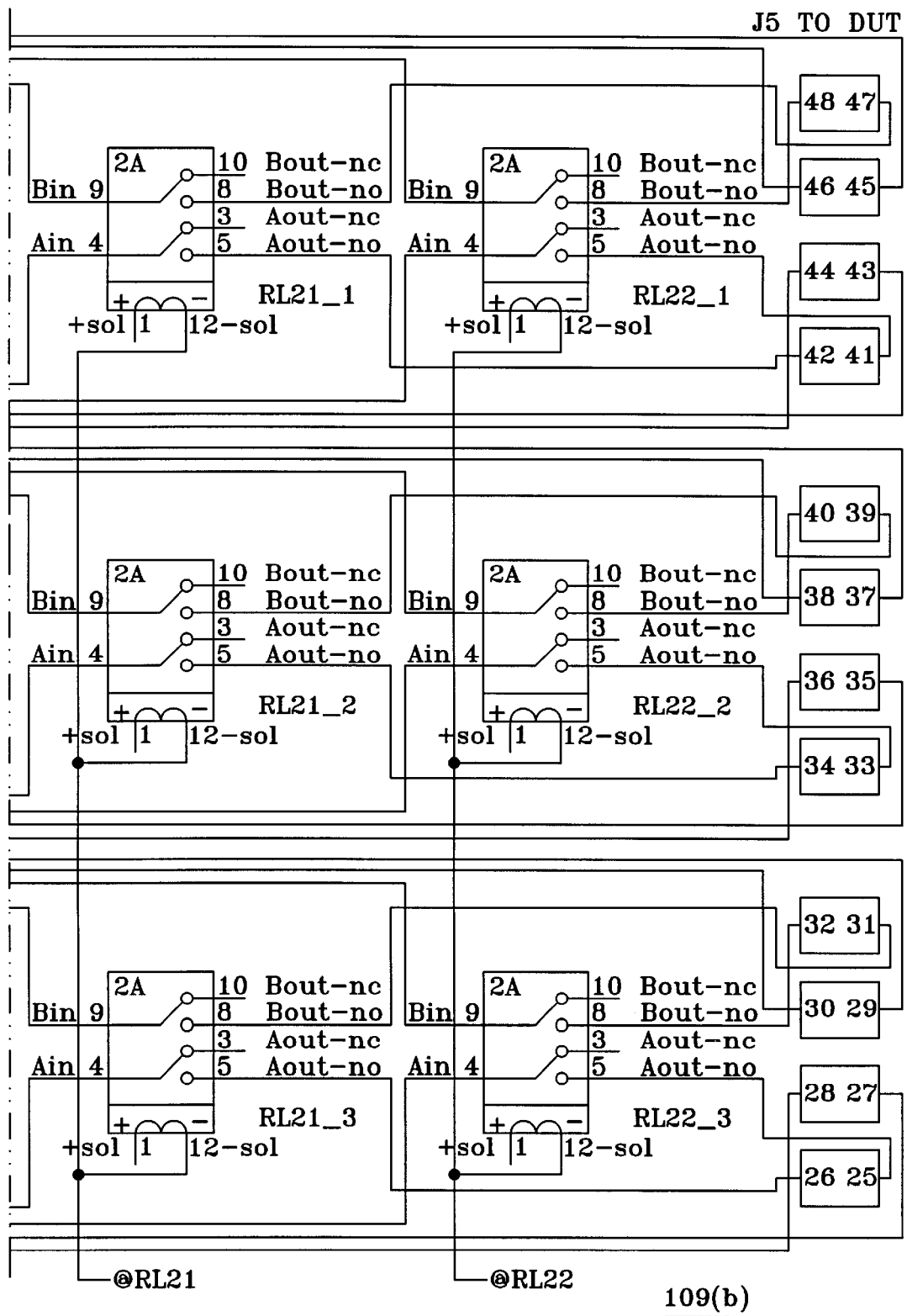

The interface switching unit (109a), (109b) shown in FIG. 2, and detailed in FIGS. 8 and 9), comprise a group of double pole, double throw relays in UPS (106) connected to the IDE/SCSI interface card (110) of the Host computer. The relay group comprises relays (19), (20), (21), & (22) as shown in FIG. 3. The interface switching unit is designed to support up to 68 individual connections simulating the plug-in/plug-out conditions of the interface cable. For example, a SCSI drive requires 50–68 connections, while an IDE drive requires only 40 connections. The relay group, comprising relays (19), (20), (21), & (22), allows the host computer (101) to test both SCSI and IDE interface disk drives. During start-up of the UPS software, the user is prompted to input the type of drive being tested. The appropriate relay's are activated and testing can commence.

The entire system is controlled with software. The software includes, a set of drivers which operate all the lower level functions (e.g. switching on a particular relay) and a set of prepackaged commands for executing more complicated functions (e.g. generating a voltage spike). The software is designed to be interactive, capable of displaying relay activity, statistical information, equipment status, and allows the user to enter commands. The software is designed such that all the foregoing information can be recorded, saved, and edited. Finally, the software includes a tutorial program.

Examples of tests usable for testing disk drives for resilience to anomalous power conditions are:
A ramp test, which requires entry of the following exemplar command lines:
Ramp <ramp_time> <unit_measure>
    This command creates the linear risetime power up waveform specified by ramp_time and unit_measure. Unit measure are in $\mu$sec (micro-second), ms (milli-second), or s (second).
    Fastest risetime is 30 $\mu$sec and the slowest is 32 sec.
    example: Ramp 70 $\mu$s creates a power on risetime of 70 $\mu$s.
    Ramp 5 s creates a power on risetime of 5 s.
A voltage spike test:
Spike <v5|v12> </+/−|spike_voltage> <spike_cap>
    This command introduces a spike of amplitude specified by spike_voltage with width (energy) determined by spike_cap on either v12 or v5 line. Spike_cap parameter is a number between 1–31 (5 bits) The higher that number is, the bigger the cap which is used to introduce the spike.

example: Spike v5 9 2 introduces a 9V spike with a "small" capacitor on the 5V line
Spike v12 16 31 introduces a 16V spike within a "big" capacitor on the 5V line Additional tests are shown below:

Hotplug <v5|v12|g>

This command hotplugs ON the respective line to the DUT. The power line which is not specified in this command will also be hotplug OFF.

example: Hotplug v5 v12 g (v5:on) (v12:on) (g:on)
Hotplug (v5:off) (v12:off) (g:off)//
Hotplug v12 g (v5:off) (v12:on) (g:on)

Bounce <v5|v12|g>

This command simulates the mechanical bounce actions during hotplug. The specified power line will be switched off (60 ms) then on (60 ms) for 10 cycles. Upon completion of the 10 cycles of off/on, all power line remains in on stage.

example: Bounce v5 v12 g (v5:bounce) (v12:bounce) (g:bounce)
Bounce (v5:on) (v12:on) (g:on)
Bounce v12 g (v5:on) (v12:bounce) (g:on)

The present invention has been described with respect to certain specific embodiments and features. However it should be readily apparent to one with ordinary skill in the art that various changes in form and details may be made without departing from the spirit and scope of the invention as set forth in the following claims. The present invention may be practiced without any element not specifically disclosed herein. Particularly, a multiplicity of plug-in computer cards, serving the same general functions disclosed herein, may be freely substituted while still being encompassed by the scope of the invention. Furthermore, a variety of tests not disclosed herein may be readily performed using the systems and apparatuses of the present invention without departing from the scope of the invention.

We claim:

1. A method for testing computer disk drives for power supply related failures, said method comprising the steps of:
   (a) providing a test system, said test system comprising:
      a host computer means for controlling said testing system and for recording resulting test data, said host computer means having an arbitrary waveform generation card, an analog to digital convertor card, and a general purpose interface bus;
      a programmable power supply means for supplying power supply voltages to said test system; and
      a universal power simulator means for simulating anomalous power conditions to said computer disk drive unit,
      wherein, said universal power simulator means comprises a relay decoding/controlling circuitry, a power switching circuitry, power ramping circuitry, voltage spike generating circuitry and disk drive computer interface adaptor circuitry;
   (b) providing a disk drive unit for testing; and
   (c) simulating anomalous power conditions comprising a power-on test sequence, a hot plugging condition, a power ramp condition, and a voltage spike condition, said simulating comprising manipulation of said universal power simulator means;
   (d) recording performance results.

2. A method for testing computer disk drives as described in claim 1, wherein:
   said step (c) comprises the step of simulating a power ramp condition generated in response to a command from said arbitrary waveform generation card for generating a test waveform having a predetermined linear risetime and amplitude.

3. A method for testing computer disk drives as described in claim 1, wherein:
   said step (c) comprising the step of simulating a voltage spike generated in response to a software command for generating a voltage spike having a predetermined voltage amplitude, and energy.

* * * * *